(12) United States Patent
Liabeuf

(10) Patent No.: US 10,057,528 B2
(45) Date of Patent: Aug. 21, 2018

(54) CIRCUIT FOR READING A SENSOR HAVING A PIXEL MATRIX WITH ANALOG-TO-DIGITAL CONVERSION HAVING A HIGH ACQUISITION RATE, AND IMAGE SENSOR INCLUDING SUCH A CIRCUIT

(71) Applicant: PYXALIS, Moirans (FR)

(72) Inventor: Christian Liabeuf, Voiron (FR)

(73) Assignee: PYXALIS, Moirans (FR)

( * ) Notice: Subject to any disclaimer, the term of this patent is extended or adjusted under 35 U.S.C. 154(b) by 0 days.

(21) Appl. No.: 15/569,083

(22) PCT Filed: May 11, 2016

(86) PCT No.: PCT/EP2016/060544
§ 371 (c)(1),
(2) Date: Oct. 24, 2017

(87) PCT Pub. No.: WO2016/180872
PCT Pub. Date: Nov. 17, 2016

(65) Prior Publication Data
US 2018/0139401 A1    May 17, 2018

(30) Foreign Application Priority Data
May 12, 2015 (FR) ..................................... 15 54214

(51) Int. Cl.
*H04N 5/378* (2011.01)
*H04N 5/376* (2011.01)
(Continued)

(52) U.S. Cl.
CPC ............. *H04N 5/378* (2013.01); *H04N 5/374* (2013.01); *H04N 5/3765* (2013.01); *H03M 1/56* (2013.01)

(58) Field of Classification Search
CPC ...... H04N 5/378; H04N 5/357; H04N 5/3575; H04N 5/3745; H04N 5/23241; H04N 5/335; H04N 5/78
See application file for complete search history.

(56) References Cited

U.S. PATENT DOCUMENTS

| 7,880,662 B2 | 2/2011 | Bogaerts |
| 2007/0080838 A1 | 4/2007 | Asayama et al. |
(Continued)

FOREIGN PATENT DOCUMENTS

EP    2 221 975 A2    8/2010

*Primary Examiner* — Antoinette Spinks
(74) *Attorney, Agent, or Firm* — Baker & Hostetler LLP

(57) ABSTRACT

A circuit for reading a pixel matrix array comprises, for each column of pixels of the matrix array: voltage-to-delay converting circuits receiving, on an input, a voltage value representative of the voltage of a read conductor of a respective column of pixels of the matrix array and delivering as output a binary signal called a comparative signal, this signal switched at a time dependent on the input voltage value; frequency-multiplying circuits, one for each of the voltage-to-delay converting circuits, receiving as input a primary clock signal and delivering as output secondary clock signals of multiplied frequency; and binary counters, receiving, on a first input, a the secondary clock signal, and, on a second input, a the binary comparative signal and counting at a rate dictated by the secondary clock signal until the binary comparative signal switches. An image sensor comprising a matrix array of pixels, in particular active pixels, and a read circuit is also provided.

11 Claims, 4 Drawing Sheets

(51) Int. Cl.
*H04N 5/374* (2011.01)
*H03M 1/56* (2006.01)

(56) References Cited

U.S. PATENT DOCUMENTS

| | | | |
|---|---|---|---|
| 2011/0115663 A1* | 5/2011 | Bogaerts | H03M 1/123 |
| | | | 341/164 |
| 2014/0232359 A1* | 8/2014 | Dash | H02M 3/158 |
| | | | 323/235 |
| 2015/0076325 A1 | 3/2015 | Higuchi et al. | |

* cited by examiner

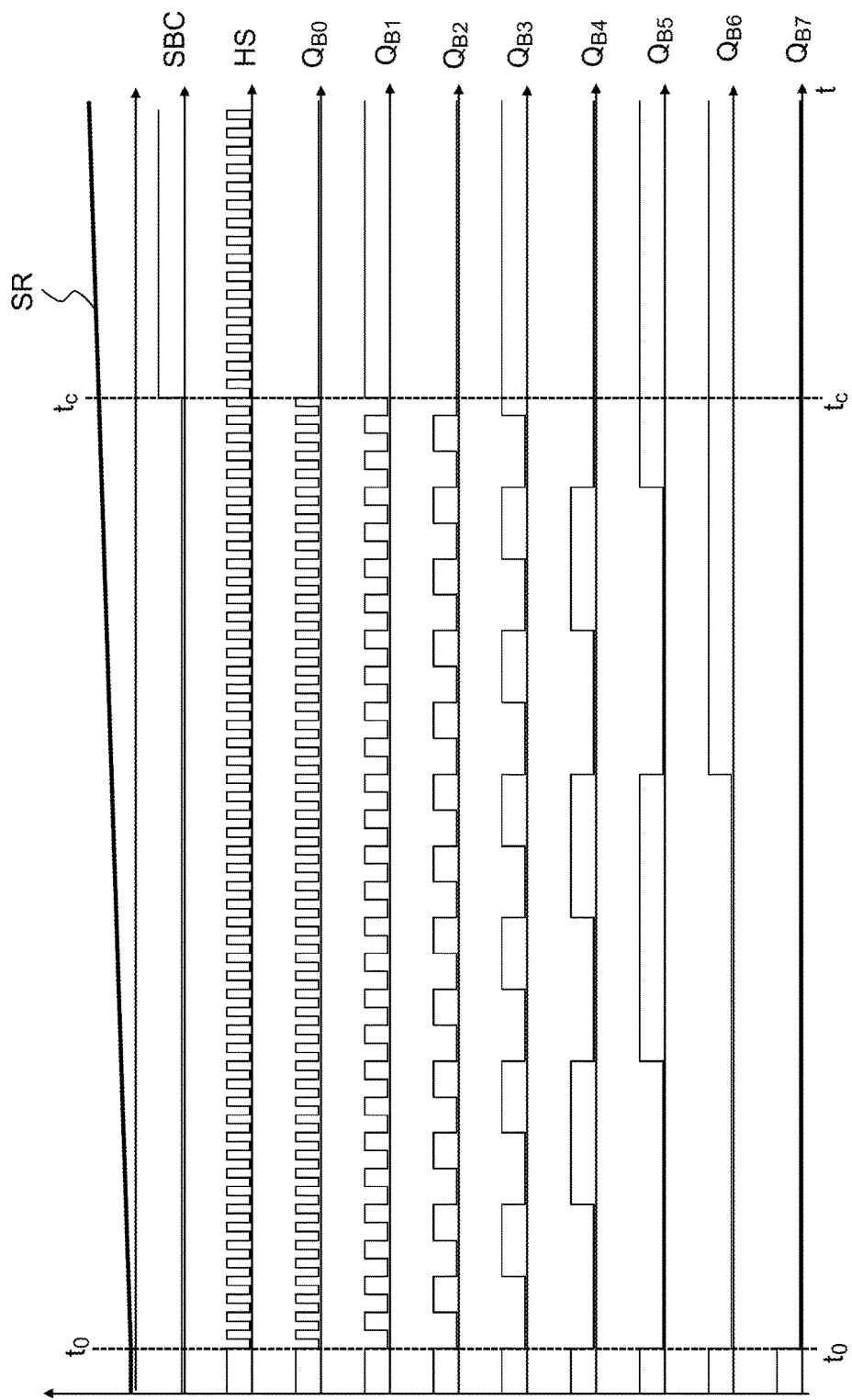

CIRCUIT FOR READING A SENSOR HAVING A PIXEL MATRIX WITH ANALOG-TO-DIGITAL CONVERSION HAVING A HIGH ACQUISITION RATE, AND IMAGE SENSOR INCLUDING SUCH A CIRCUIT

CROSS-REFERENCE TO RELATED APPLICATIONS

This application is a National Stage of International patent application PCT/EP2016/060544, filed on May 11, 2016, which claims priority to foreign French patent application No. FR 1554214, filed on May 12, 2015, the disclosures of which are incorporated by reference in their entirety.

FIELD OF THE INVENTION

The invention relates to a circuit for reading a sensor including a pixel matrix array and for converting, from analog to digital, the signals read, and to an image sensor comprising such a read circuit. The invention aims to increase the rate of acquisition of images without sacrificing conversion resolution, i.e. the number of brightness levels in the acquired digital image, or, equivalently, to improve conversion resolution without decreasing acquisition rate.

The invention in particular applies to the case of a matrix array of active pixels, in particular of CMOS type, but it may generally apply to any matrix-array sensor that is read out "at the foot of the column".

BACKGROUND

FIG. 1 illustrates a sensor including a matrix array of active pixels and a read circuit according to the prior art.

The matrix array MPA comprises a plurality (9 in the example of the figure, several thousand in most actual cases) of active pixels PX that are generally produced in CMOS (complementary metal-oxide-semiconductor) technology, said pixels being arranged in rows and columns; the columns are identified by the references C1, C2 and C3. Each pixel comprises a photodiode that generates electrical charge when it is illuminated by light; the photodiode accumulates, during what is called an integration time, the generated charge, that it is then possible to read directly or via an intermediate storage node.

The matrix array is read like a random-access memory: all the pixels of a given column are connected to the same read conductor (LC1 for column C1; LC2 for column C2; LC3 for column C3); a row-selecting signal (not shown) selects a single pixel for each column, which transfers a voltage representative of the accumulated charge to the read conductor of the corresponding column.

At the foot of each column, a respective sample-and-hold circuit (not shown in FIG. 1; referenced SH in FIG. 3A) acquires the voltage on the read conductor and converts it to digital format with a ramp-type converter. In the simplest embodiment, the voltage signal acquired by the sample-and-hold circuit is delivered to a first input of an analog comparator (CMP1 for column C1, CMP2 for column C2, CMP3 for column C3) which receives, on its second input, a voltage ramp SR that is common to a plurality of columns and that exceeds, at the end of the conversion, the sampled voltages on the conductors LC1, LC2, LC3, etc. The binary output signal of the comparator (SBC1, SBC2, SBC3) switches when the ramp SR is equal to the voltage present on the first input of the comparator. Thus a voltage-to-delay conversion is obtained. Other voltage-to-delay converting architectures exist and may be applied to the analog-digital conversion of signals generated by a matrix-array sensor.

In this configuration, a clock signal H drives a Gray-code counter CCG that is common to all the columns (Gray code is preferred to natural binary code because it is more robust with respect to errors due to the appearance of transient states; however, use of a natural binary code, or any other type of binary code, is also possible) in order to perform a count that starts at the same time as the voltage ramp, or with a known and controllable temporal offset (in FIG. 1, a double-headed arrow symbolizes the synchronization between the ramp generator GR and the Gray-code counter CCG). In a manner known per se, the synchronization may be achieved via a digital sequencer that sends start signals simultaneously (or with a preset offset) to the ramp generator and to the counter. The Gray code generated by the counter CCG is propagated to a bank of registers with parallel inputs and series outputs, R1, R2, R3—one bank per column. The switching of each output signal of a comparator—SBC1, SBC2, SBC3—triggers the sampling of the value of the counter to the corresponding register. Thus, each register stores the Gray code generated at the moment at which the voltage ramp common to all the comparators was equal to the voltage signal corresponding to the column of pixels with which it is associated.

The set of components made up of the sample-and-hold circuits, the comparators, the registers and, optionally, the ramp generator, the Gray-code counter and/or the clock-signal generator is referred to as the read circuit CL.

The read circuit of the image sensor of FIG. 1 has a simple structure that consumes little power and is easy to implement. The result of the analog-digital conversion is monotonic, has a good linearity and a low dispersion from column to column. Its drawback is that it is difficult to obtain both a good conversion resolution (for example, 14 bits) and a high acquisition rate (faster than 10 µs). Specifically, for a resolution of 14 bits, it is necessary to count up to 16384. If the clock signal has a frequency of 400 MHz, this requires about 41 µs. Decreasing conversion time by a factor of 8—which would allow an acquisition rate of about 1 image/5 µs—would require the clock frequency to be multiplied by 8 (3.2 GHz), this being impossible, or in any case not possible with the electronic technologies used to produce active matrix-array sensors. In addition, when clock frequency is increased, it becomes difficult to propagate the Gray code synchronously over required distances which may be large (several millimeters) if the number of columns of the matrix is high.

An alternative structure uses a separate (Gray or natural binary) counter for each column. This does not allow the rate of acquisition of images to be significantly increased, because it is still necessary to generate a high clock frequency and to propagate it synchronously over a large distance.

These architectures are described in document U.S. Pat. No. 7,880,662.

Document EP 2 221 975 describes a circuit for reading a sensor including a matrix array of active pixels, said circuit comprising a local clock for each column. As the clock signal need not be propagated, its frequency may be higher. In contrast, this circuit implements a complex mechanism in order to prevent synchronization errors in the synchronization of the various local clocks.

The invention aims to overcome the drawbacks of the prior art. More particularly, it aims to provide a read circuit allowing a high image-acquisition rate to be achieved without sacrificing conversion resolution and via means that are simpler than those employed in the circuit of the aforementioned document EP 2 221 975.

According to the invention, this aim is achieved by using a clock that is common to the various columns, referred to as the primary or reference clock, having a relatively low frequency, and local frequency multipliers at the foot of each column, which generate what are called secondary, or local, clock signals that drive respective counters. Only the primary clock must be propagated and, as it has a relatively low frequency, this poses no particular difficulty. The use of frequency multipliers driven by a common primary clock allows the synchronization of the secondary clock signals to be ensured. Moreover, according to one advantageous embodiment of the invention, the counting may be carried out by modified natural binary counters in which the least significant bit follows the secondary clock, instead of switching on each falling or rising front, allowing a counting rate that is double the clock frequency to be achieved. This allows a gain of a factor of two in the rate of acquisition of the images or of one bit of conversion resolution for a given rate.

SUMMARY OF THE INVENTION

Thus, one subject of the invention is a circuit for reading a sensor including a pixel matrix array, said circuit comprising:
a plurality of voltage-to-delay converting circuits configured to receive, on an input, a voltage value representative of the voltage of a read conductor of a respective column of pixels of said matrix array and to deliver as output a binary signal that is what is called a comparative signal, this signal being switched at a time dependent on the input voltage value;
characterized in that it also comprises:
a plurality of frequency-multiplying circuits, each associated with a group of at least one said voltage-to-delay converting circuit, having respective inputs connected to a common clock transmission line that is intended to propagate what is called a primary clock signal, and respective outputs for what are called secondary clock signals that are of a frequency that is a multiple of said primary clock signal, these circuits being configured to multiply the frequency of the primary clock signal present on their input by the same multiplicative factor; and
a plurality of binary counters, one for each of said voltage-to-delay converting circuits, having a given number of counting bits and configured to receive, on a first input, a said secondary clock signal, and, on a second input, the binary comparative signal delivered by the corresponding voltage-to-delay converting circuit, each of said counters being configured to count at a rate dictated by said secondary clock signal until said binary comparative signal switches.

According to advantageous embodiments of such a read circuit:
Each of said voltage-to-delay converting circuits may be of the single ramp type and comprise a generator of a linear voltage ramp and an analog comparator configured to compare a constant voltage to said linear voltage ramp.
Each of said frequency-multiplying circuits may be associated with one and only one voltage-to-delay converting circuit.
Each of said binary counters may be a natural binary counter comprising:

a latch-type memory element having a first input configured to receive a said secondary clock signal and forming said first input of the natural binary counter, a second input configured to receive the binary comparative signal delivered by the corresponding voltage-to-delay converting circuit, and an output, said memory element being configured to transmit, to its output, the signal present on its first input when the signal present on its second input takes a first value, and to maintain unchanged the signal present on its output when the signal present on its second input takes a second value complementary to the first; and
a plurality of divide-by-2 flip-flops connected in cascade, a clock input of the first of these flip-flops being connected to the output of said memory element.

Each of said frequency-multiplying circuits may comprise a digital phase-locked loop including a frequency divider in its feedback loop.

A sample-and-hold circuit may be arranged on the input of each of said voltage-to-delay converting circuits.

The read circuit may also include a generator of said primary clock signal, connected to said common clock transmission line.

Said frequency-multiplying circuits may have a multiplicative factor comprised between 2 and 16.

Another subject of the invention is an image sensor comprising a sensor including a pixel matrix array, comprising a plurality of pixels arranged in rows and columns, each of said columns having a respective read conductor, and a circuit for reading said matrix array as claimed in one of the preceding claims, said inputs of the voltage-to-delay converting circuits of said read circuit being connected to respective read conductors of the columns of pixels of the matrix array.

Said read circuit and said sensor including a pixel matrix array may be co-integrated monolithically.

Said pixels may in particular be active pixels.

BRIEF DESCRIPTION OF THE DRAWINGS

Other features, details and advantages of the invention will become apparent on reading the description with reference to the appended figures which are given by way of example and show, respectively:

FIG. 4, timing diagrams illustrating the operation of this read circuit.

In the figures, references that are the same refer to elements that are identical or equivalent.

DETAILED DESCRIPTION

Figure 2:
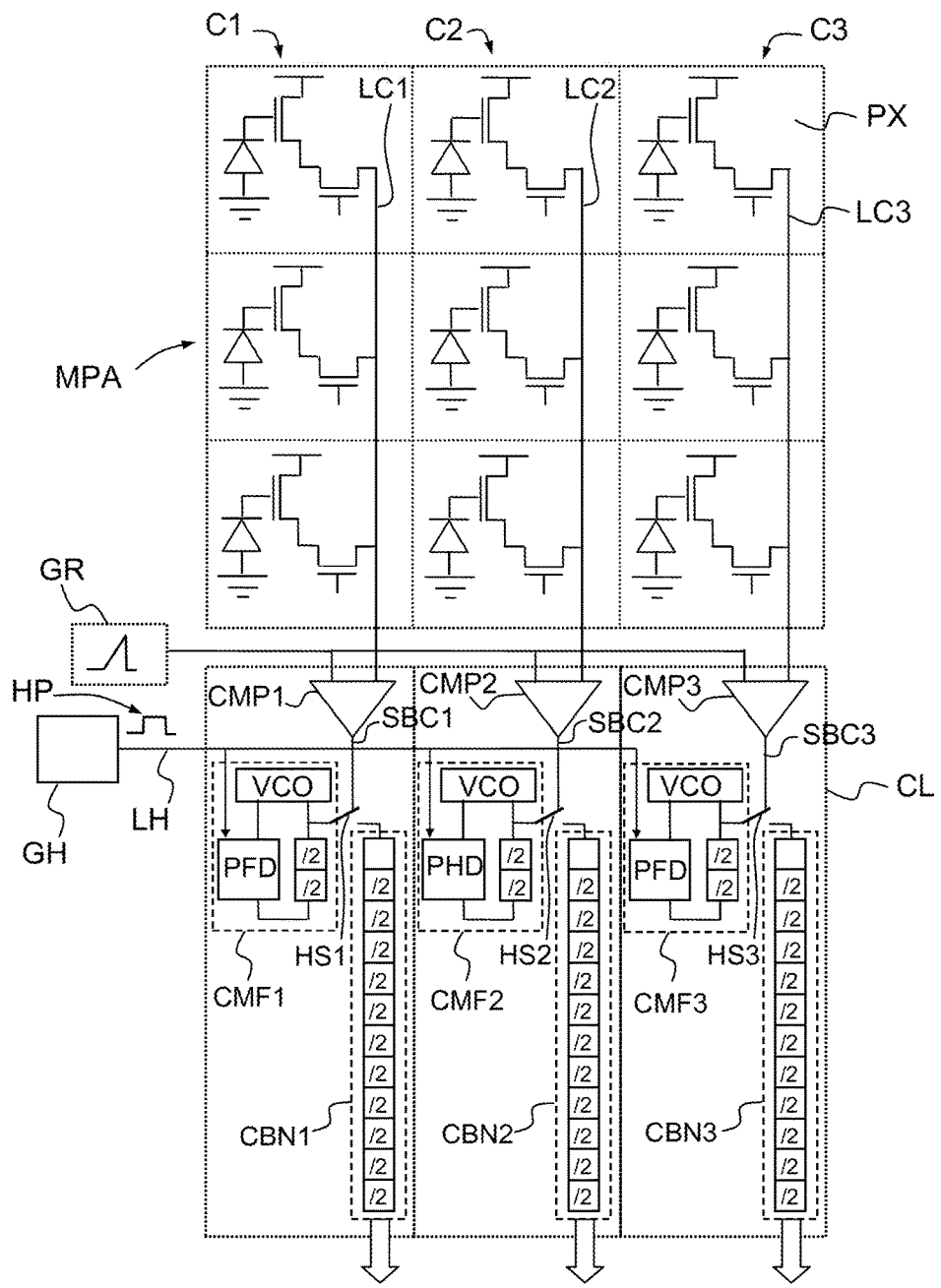
FIG. 2, a functional diagram of an image sensor including a matrix array of active pixels and a read circuit according to one embodiment of the invention.

It should be noted that, in the diagram of FIG. 2, there is no more propagation of a binary code, the count is generated locally at the foot of each column by natural binary counters CBN1, CBN2, CBN3 (Gray counters, or any other type of binary counters, could also be envisioned). These counters are driven by (local) secondary clock signals HS1, HS2, HS3 that are generated locally. Contrary to the case of aforementioned document EP 2 221 975 however, the secondary clock signals are not generated by independent local oscillators but are obtained by multiplying the frequency of a primary, or reference, clock signal HP that is generated by an oscillator GH and propagated through the read circuit over a clock line LH.

In the embodiment of FIG. 2, the frequency multiplication is ensured by digital phase-locked loops comprising a phase comparator PFD, a voltage-controlled oscillator VCO and a divider of frequency by a set or variable factor. In the example of the figure, this factor is 4 and is obtained by connecting in cascade two flip-flops mounted to divide frequency by 2—symbol "/2".

Both the primary clock and the secondary clocks have square-wave waveforms. It is however not essential that these waveforms have a duty cycle of 50% as in the case of the example.

Figure 1:
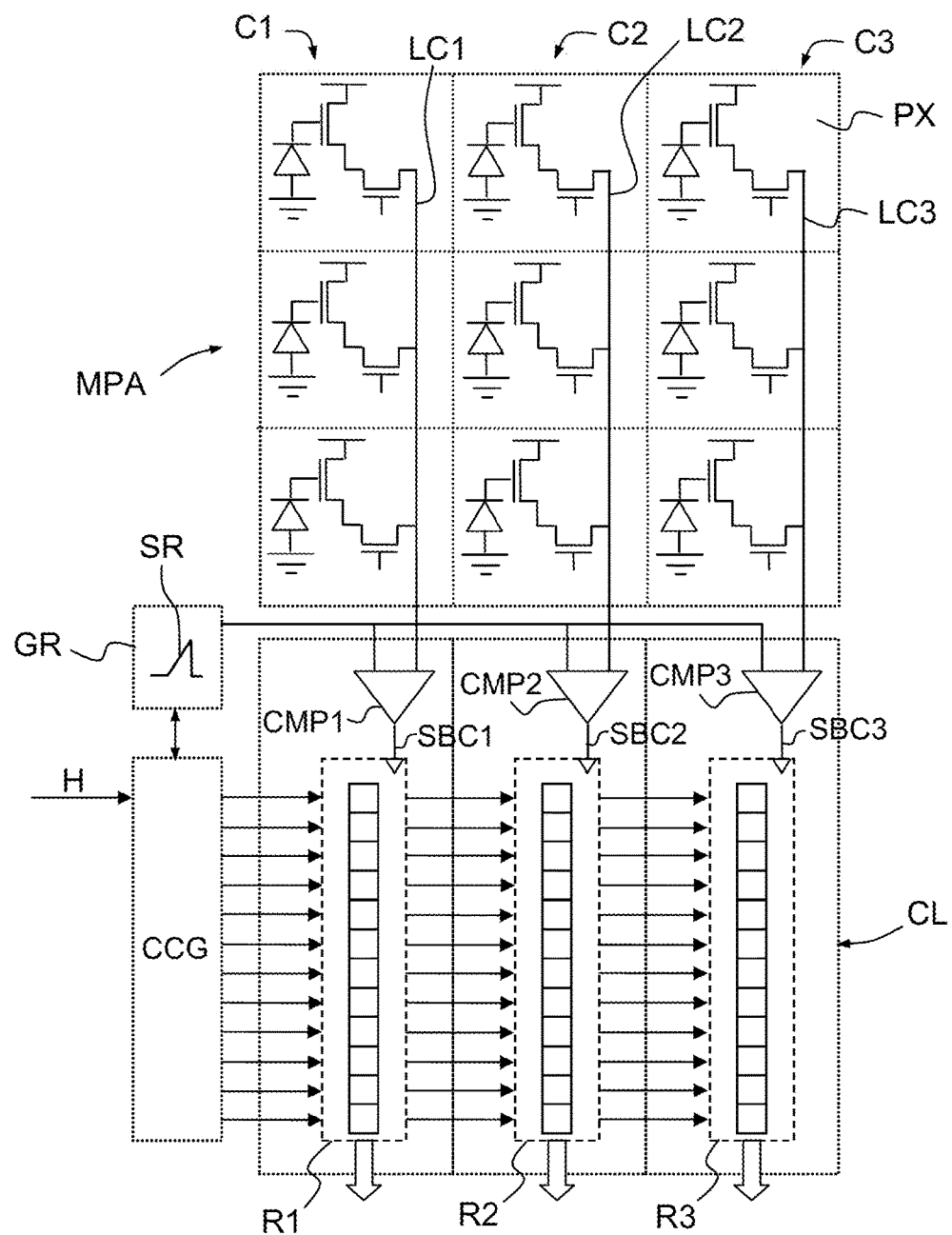
FIG. 1, described above, a functional diagram of an image sensor including a matrix array of active pixels and a known prior-art read circuit.

As in the circuit of FIG. 1, switching of the signal SBC1, SBC2, SBC3 of a comparator CMP1, CMP2, CMP3 stops the counting by the corresponding counter CBN1, CBN2, CBN3.

Figure 3A:
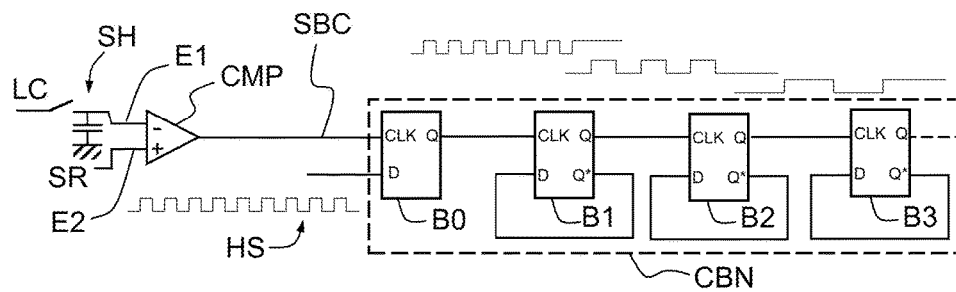
FIGS. 3A, 3B and 3C, simplified circuit diagrams of various sections of the read circuit of FIG. 2.
Figure 3B:
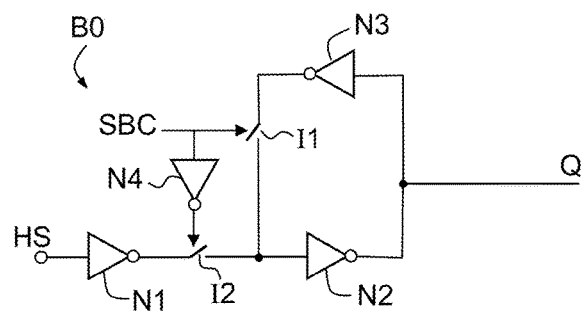
Figure 3C:
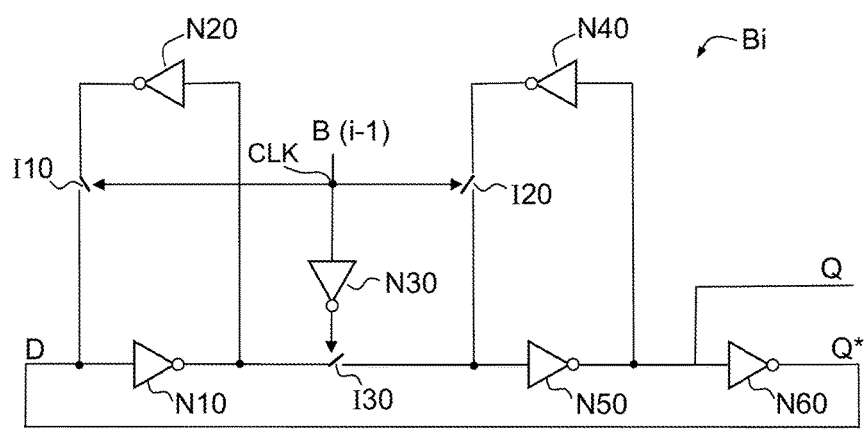

FIGS. 3A to 3C illustrate the structure of a counter CBN according to one advantageous embodiment of the invention.

It is known that a natural binary counter may be obtained by connecting in cascade divide-by-2 flip-flops (B1, B2, B3 in FIG. 3A). It may for example be a question of D flip-flops in which:

the complementary output Q* is looped back on the input D;

the output Q is connected to the clock input CLK of the following flip-flop (except for the last flip-flop of the cascade).

The CBN counter adopts this structure, except in that the first flip-flop, which corresponds to the least significant counting bit, is replaced by a latch-type memory element B0 that copies, to its output, the clock signal HS provided that the comparative signal SBC has a first value (for example a low value) and that freezes its output when SBC takes a second value that is complementary to the first (a high value, in the considered example). Thus, the natural binary counter CBN of FIG. 3A switches two times for each clock cycle, whereas in the case of a counter formed by simply connecting D flip-flops in cascade, which switches only on rising or descending fronts, the count value is equal to the number of received clock pulses. The use of such a latch-type memory element instead of a flip-flop for the least significant bit allows, for a given clock frequency, the time required to count to $2^N-1$, N being the number of counting bits, to be divided by two. In the application considered here, this allows, at unchanged conversion resolution (i.e. for the same number N of bits) the rate of acquisition of images to be multiplied by two or one resolution bit to be gained at unchanged rate.

FIG. 3B illustrates the structure and operation of the element B0. The binary comparative signal SBC drives the on/off switches I1 and I2, the latter by way of the inverter N4. In the considered example, provided that SBC is at a low level (this meaning that the voltage ramp SR is below the voltage across the terminals of the sample-and-hold circuit SH that is connected to the column read conductor LC, see FIG. 3A) the on/off switch I1 is open and the on/off switch I2 is closed. The clock signal HS is delivered to the output Q via the two inverters N1, N2: the element is therefore transparent. The inverter N1 is optional, insofar as the output of the element B0 could simply be inverted. When the voltage ramp SR is equal to the voltage across the terminals of the sample-and-hold circuit SH, the comparative signal SBC passes to a high level, I2 opens and I1 closes. Thus, the clock HS is disconnected from the loop and the output Q keeps the value that it had when switching occurred, which value is stored in the memory cell formed by the inverters N2 and N3. If N1 is present, the on/off switch I1 can be emitted, at the price of a current fluctuation (glitch) on switching.

FIG. 3C illustrates the structure of a flip-flop Bi (i comprised between 1 and N). The signal present on the clock input CLK of the flip-flop is delivered by the output Q of the flip-flop B(i–1)—the memory element B0 if i=1; the inverted output Q* is looped back on the input D. The on/off switches I10, I20 and I30 are driven by the signal CLK—the latter by way of the inverter N30. The operation of the circuit, which also comprises the inverters N10, N20 (forming a first memory cell), N40, N50 (forming a second memory cell) and N60 (allowing the inverted output Q* to be obtained), is that of a conventional D flip-flop.

It will be understood that the diagrams of FIGS. 3B and 3C are simplified and presented merely for explanatory purposes.

The timing diagrams of FIG. 4 illustrate the operation of the read circuit.

The first timing diagram from the top illustrates the voltage ramp SR, that starts at the time $t_0$.

The binary comparative signal SBC (second timing diagram) initially takes a low value, then switches to a high value at the time $t_c$.

The third timing diagram illustrates the secondary clock signal HS.

The fourth timing diagram illustrates the output signal of the memory element B0—designated by $Q_{B0}$—which represents the least significant bit and follows the secondary clock between $t_0$ and $t_c$.

The other timing diagrams illustrate the output signals of the flip-flops B1-B7 ($Q_{B1}$-$Q_{B7}$) each having a frequency divided by two with respect to that of the preceding timing diagram.

The primary clock signal is not shown; however, it will be noted that it has a frequency lower than that of HS by a factor of 4, i.e. the same frequency as $Q_{B2}$.

According to the invention, with a primary clock at 400 MHz it is possible to generate secondary clocks at 1.6 GHz, corresponding directly to the least significant bit, thereby allowing an acquisition rate of about one row every 5 μs with a resolution of 14 bits. With the read circuit of FIG. 1, to obtain these performance levels, a 3.2 GHz counter clock would be required, which would not allow the counter to be propagated synchronously. For a given (primary) propagated clock frequency, the architecture of FIG. 2 multiplies the rate of acquisition of the images by a factor of 8: a factor of 4 obtained by virtue of the frequency-multiplying circuits CMF1-CMF3 and another factor of 2 due to the use of the natural binary counter of FIGS. 3A-3C.

The invention has been described with reference to one particular embodiment, but many variants may be envisioned. For example:

As was mentioned above, it is not essential for the pixels of the matrix array to be active. It is enough that they allow a "foot-of-column" read-out.

As was also mentioned above, a voltage-to-delay converting circuit of a type other than that described may be used. Such a circuit will most often comprise an analog comparator and a ramp generator, and advantageously at least one sample-and-hold circuit, but these elements may be arranged otherwise than in the example of FIG. 2. For example, a voltage-to-delay converting circuit could compare the input signal added to the linear voltage ramp with a reference voltage.

A single frequency-multiplying circuit may deliver the secondary clock to a plurality of (but not all the) voltage-to-delay converting circuits; it is nevertheless necessary for the secondary clock to remain a "local" signal; thus, preferably, a frequency-multiplying circuit will be associated with a number of voltage-to-delay converting circuits lower than or equal to 16.

In order to minimize power consumption, switching of a voltage-to-delay converting circuit may cause the associated frequency-multiplying circuit to stop. If a plurality of voltage-to-delay converting circuits are associated with a given frequency-multiplying circuit, the latter will be stopped only when all the associated converters have been switched.

The frequency multiplication factor between the primary clock signal and the secondary clock signals need not necessarily be equal to 4. Advantageously, it may be higher than 2, and for example comprised between 2 and 16. The fact that it is a power of two is advantageous from the point of view of simplicity, but is not essential.

The frequency-multiplying circuits need not necessarily be based on phase-locked loops. Specifically, a synchronization is not necessary here; any frequency-multiplying circuit, whether analog, purely digital or hybrid, could therefore be used.

Other natural or Gray binary counters may be used. The count could even be a countdown.

Advantageously, a read circuit according to the invention may have a modular structure, the voltage-to-delay converting circuits, the frequency-multiplying circuits and the counters associated with the various columns of the matrix array of active pixels being identical to one another. However, a simple functional identicalness may suffice.

Advantageously, the read circuit (optionally including the primary clock generator and, where appropriate, the ramp generator) and the matrix array of active pixels may be cointegrated, typically in CMOS technology, but this is not essential.

The invention claimed is:

1. A circuit for reading a sensor including a pixel matrix array, said circuit comprising:
a plurality of voltage-to-delay converting circuits configured to receive, on an input, a voltage value representative of the voltage of a read conductor of a respective column of pixels of said matrix array and to deliver as output a binary signal called a comparative signal, this signal being switched at a time dependent on the input voltage value;
further comprising:
a plurality of frequency-multiplying circuits, each associated with a group of at least one said voltage-to-delay converting circuit, having respective inputs connected to a common clock transmission line that is intended to propagate a clock signal called a primary clock signal, and respective outputs for clock signals, called secondary clock signals, that are of a frequency that is a multiple of said primary clock signal, these circuits being configured to multiply the frequency of the primary clock signal present on their input by the same multiplicative factor; and
a plurality of binary counters, one for each of said voltage-to-delay converting circuits, having a given number of counting bits and configured to receive, on a first input, a said secondary clock signal, and, on a second input, the binary comparative signal delivered by the corresponding voltage-to-delay converting circuit, each of said counters being configured to count at a rate dictated by said secondary clock signal until said binary comparative signal switches.

2. The read circuit as claimed in claim 1, wherein each of said voltage-to-delay converting circuits is of the single ramp type and comprises a generator of a linear voltage ramp and an analog comparator configured to compare a constant voltage to said linear voltage ramp.

3. The read circuit as claimed in claim 1, wherein each of said frequency-multiplying circuits is associated with one and only one voltage-to-delay converting circuit.

4. The read circuit as claimed in claim 1, wherein each of said binary counters is a natural binary counter comprising:
a latch-type memory element having a first input configured to receive a said secondary clock signal and forming said first input of the natural binary counter, a second input configured to receive the binary comparative signal delivered by the corresponding voltage-to-delay converting circuit, and an output, said memory element being configured to transmit, to its output, the signal present on its first input when the signal present on its second input takes a first value, and to maintain unchanged the signal present on its output when the signal present on its second input takes a second value complementary to the first; and
a plurality of divide-by-2 flip-flops connected in cascade, a clock input of the first of these flip-flops being connected to the output of said memory element.

5. The read circuit as claimed in claim 1, wherein each of said frequency-multiplying circuits comprises a digital phase-locked loop including a frequency divider in its feedback loop.

6. The read circuit as claimed in claim 1, wherein a sample-and-hold circuit is arranged on the input of each of said voltage-to-delay converting circuits.

7. The read circuit as claimed in claim 1, also comprising a generator of said primary clock signal, connected to said common clock transmission line.

8. The read circuit as claimed in claim 1, wherein said frequency-multiplying circuits have a multiplicative factor comprised between 2 and 16.

9. An image sensor comprising a sensor including a pixel matrix array, comprising a plurality of pixels arranged in rows and columns, each of said columns having a respective read conductor, and a circuit for reading said matrix array as claimed in claim 1, said inputs of the voltage-to-delay converting circuits of said read circuit being connected to respective read conductors of the columns of pixels of the matrix array.

10. The image sensor as claimed in claim 9, wherein said read circuit and said sensor including a pixel matrix array are co-integrated monolithically.

11. The image sensor as claimed in claim 9, wherein said pixels are active pixels.

* * * * *